United States Patent
Atrash et al.

(10) Patent No.: US 7,439,796 B2
(45) Date of Patent: Oct. 21, 2008

(54) CURRENT MIRROR WITH CIRCUITRY THAT ALLOWS FOR OVER VOLTAGE STRESS TESTING

(75) Inventors: Amer Hani Atrash, Dallas, TX (US); Reed Wilburn Adams, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 11/422,144

(22) Filed: Jun. 5, 2006

(65) Prior Publication Data
US 2008/0122475 A1 May 29, 2008

(51) Int. Cl.
*G05F 1/10* (2006.01)
(52) U.S. Cl. .................. 327/538; 327/543; 323/112; 323/115; 323/116; 323/117; 330/288
(58) Field of Classification Search .................. 327/538, 327/543, 80, 143, 142, 198; 323/312, 315, 323/316, 317; 330/288
See application file for complete search history.

(56) References Cited
U.S. PATENT DOCUMENTS

| | | | | |
|---|---|---|---|---|
| 4,853,610 A | * | 8/1989 | Schade, Jr. | 323/316 |
| 5,864,247 A | * | 1/1999 | Hirano et al. | 327/143 |
| 6,404,275 B1 | * | 6/2002 | Voldman et al. | 327/538 |
| 6,864,702 B1 | | 3/2005 | Teggatz et al. | |

* cited by examiner

*Primary Examiner*—Kenneth B. Wells
*Assistant Examiner*—Brandon S Cole
(74) *Attorney, Agent, or Firm*—Alan K. Stewart; W. James Brady; Frederick J. Telecky, Jr.

(57) ABSTRACT

A current mirror circuit that allows for over voltage stress testing includes: a first transistor; a second transistor having a gate coupled to a gate of the first transistor; a switch coupled between the gate of the first transistor and the drain of the first transistor; a bias source coupled to a control node of the switch such that the switch is ON during normal current mirror operation, and the switch is OFF during over voltage stress testing; and a clamp coupled between the control node of the switch and a source node.

8 Claims, 1 Drawing Sheet

CURRENT MIRROR WITH CIRCUITRY THAT ALLOWS FOR OVER VOLTAGE STRESS TESTING

FIELD OF THE INVENTION

The present invention relates to electronic circuitry and, in particular, to a current mirror with circuitry that allows for over voltage stress testing.

BACKGROUND OF THE INVENTION

To perform an over voltage stress test (OVST) on a high-side PMOS in a current mirror configuration, the gate of the PMOS device must be raised to a high voltage using a probe pad and the current into the gate of the device must be measured. To accurately measure gate current, the DC current into all other components connected to the gate node must be very low (ideally zero). The two-fold problem is that all components connected to the gate node must be able to withstand a high DC voltage and must not provide any current paths from the node.

A basic prior art PMOS current mirror is shown in FIG. 1. The circuit of FIG. 1 includes PMOS transistors Mp2 and Mp3; NMOS transistors Mn3 and Mn1; voltage nodes Vgp, Vdd, Vout, Vcc3, and Von; and output current Iout. When considering the basic prior art PMOS current mirror, as shown in FIG. 1, the problem specifically is when the voltage on node Vgp is raised above node Vdd. In this case, the parasitic diode from the drain to the well of device Mp2 is activated, providing a significant current path from node Vgp to source node Vdd and making OVST impossible.

SUMMARY OF THE INVENTION

A current mirror circuit that allows for over voltage stress testing includes: a first transistor; a second transistor having a gate coupled to a gate of the first transistor; a switch coupled between the gate of the first transistor and the drain of the first transistor; a bias source coupled to a control node of the switch such that the switch is ON during normal current mirror operation, and the switch is OFF during over voltage stress testing; and a clamp coupled between the control node of the switch and a source node.

DETAILED DESCRIPTION OF PREFERRED EMBODIMENTS

Figure 1:
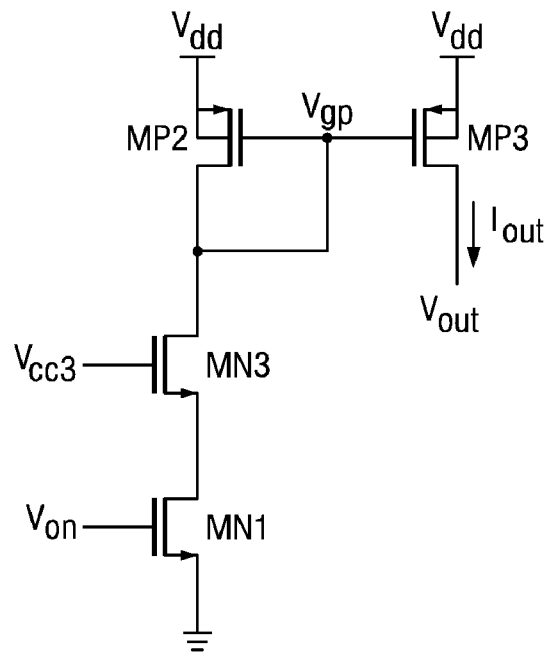
FIG. 1 is a circuit diagram of a basic prior art current mirror.
Figure 2:
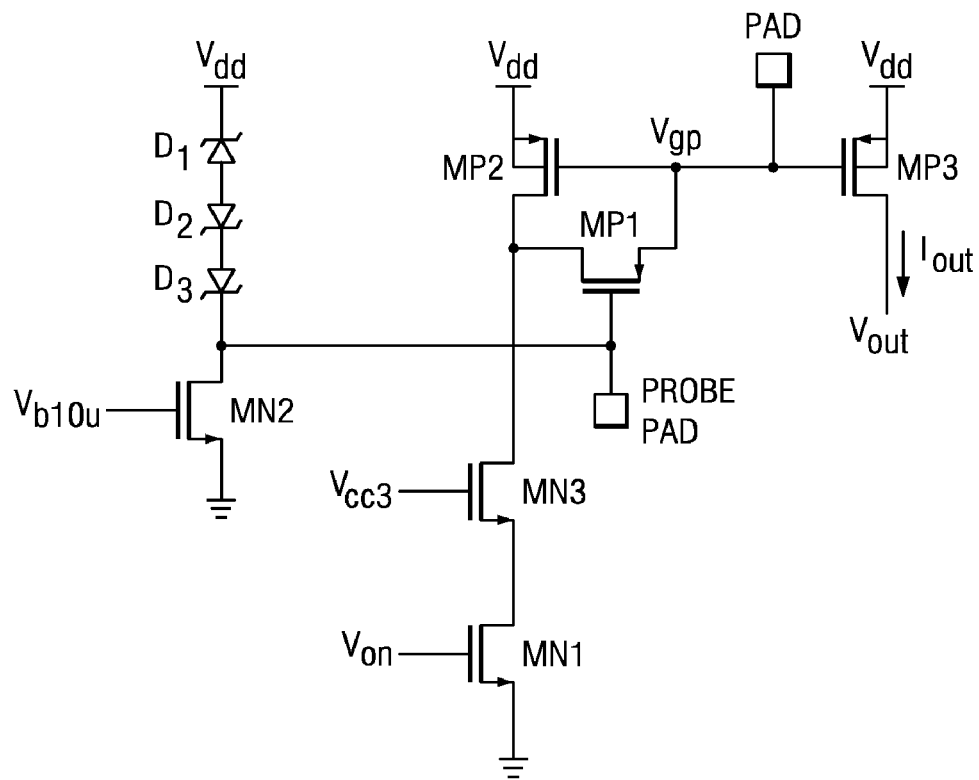
FIG. 2 is a circuit diagram of a preferred embodiment current mirror circuit with over voltage stress testing capability.

The preferred embodiment current mirror circuit with over voltage stress testing capability, shown in FIG. 2, introduces a switch Mp1 between the drain and gate of device Mp2. The circuit of FIG. 2 includes the elements of the circuit of FIG. 1, and additionally includes diodes D1, D2, and D3; NMOS transistor Mn2; and voltage node Vb10u. The well and source of switch Mp1 are connected to node Vgp to prevent activation of any parasitic components during over voltage stress testing (OVST). The gate of switch Mp1 is biased to remain on during normal operation by transistor Mn2 and bias voltage node Vb10u. In addition, a clamp to source node Vdd (diodes D1, D2, and D3) is used to limit the maximum gate-to-source voltage of the switch Mp1. Device Mn2 is biased to provide a low voltage to the gate of Mp1 during normal operation and is shut off during an OVST test, thereby turning off switch Mp1. The switch Mp1 during OVST testing will be off and serves to eliminate the current path to source node Vdd and protects the remaining circuitry (devices Mn1 and Mn3) from the high voltage applied to node Vgp during OVST.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A current mirror circuit that allows for over voltage stress testing comprising:
    a first PMOS transistor;
    a second PMOS transistor having a gate coupled to a gate of the first transistor;
    a switch coupled between the gate of the first transistor and a drain of the first transistor;
    a bias source coupled to a control node of the switch, wherein the bias source is ON for normal operation of the current mirror and OFF during voltage stress testing; and
    a clamp coupled between the control node of the switch and a source node.

2. The circuit of claim 1 further comprising:
    a third transistor coupled in series with the first transistor; and
    a fourth transistor coupled in series with the third transistor.

3. The circuit of claim 2 wherein the third and fourth transistors are NMOS transistors.

4. The circuit of claim 1 wherein the switch is a transistor.

5. The circuit of claim 1 wherein the switch is a PMOS transistor.

6. The circuit of claim 1 wherein the bias source comprises a transistor.

7. The circuit of claim 1 wherein the bias source comprises an NMOS transistor.

8. The circuit of claim 1 wherein the clamp comprises diodes.

* * * * *